(12) United States Patent  
Uehara

(10) Patent No.: US 10,812,019 B2  
(45) Date of Patent: Oct. 20, 2020

(54) OSCILLATOR, ELECTRONIC DEVICE, AND VEHICLE

(71) Applicant: Seiko Epson Corporation, Tokyo (JP)

(72) Inventor: Jun Uehara, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/505,875

(22) Filed: Jul. 9, 2019

(65) Prior Publication Data

US 2020/0021243 A1   Jan. 16, 2020

(30) Foreign Application Priority Data

Jul. 10, 2018 (JP) ................................ 2018-130437

(51) Int. Cl.
*H03B 5/36* (2006.01)
*G01R 31/317* (2006.01)
*H03B 5/04* (2006.01)

(52) U.S. Cl.
CPC ......... *H03B 5/36* (2013.01); *G01R 31/31727* (2013.01); *H03B 5/04* (2013.01); *H03B 5/362* (2013.01); *H03B 2200/004* (2013.01)

(58) Field of Classification Search
CPC ...... H03B 5/32; H03B 5/36; G01R 31/31727; G06F 1/04; G06F 11/30
See application file for complete search history.

(56) References Cited

U.S. PATENT DOCUMENTS

| 5,657,361 A * | 8/1997 | Inagaki | G01R 23/005 |
| | | | 327/48 |
| 6,333,646 B1 | 12/2001 | Tsuzuki | |
| 2005/0246586 A1 | 11/2005 | Chang | |
| 2007/0146083 A1* | 6/2007 | Hein | H03L 7/0992 |
| | | | 331/16 |
| 2008/0224753 A1 | 9/2008 | Tsuji | |
| 2011/0057735 A1 | 3/2011 | Honda | |
| 2013/0266053 A1 | 10/2013 | Tazaki | |
| 2017/0302285 A1* | 10/2017 | Niwa | H03B 5/32 |

FOREIGN PATENT DOCUMENTS

| JP | H08-221150 A | 8/1996 |
| JP | 2012-147171 A | 8/2012 |
| WO | WO-1999-059051 A1 | 11/1999 |

* cited by examiner

*Primary Examiner* — Ryan Johnson
(74) *Attorney, Agent, or Firm* — Harness, Dickey & Pierce, P.L.C.

(57) ABSTRACT

An oscillator includes a resonator, a circuit device that is electrically coupled to the resonator and generates a clock signal, a control terminal that is electrically coupled to the circuit device, and an output terminal that is electrically coupled to the circuit device and outputs the clock signal. The circuit device includes an abnormality detection circuit and sets a potential of the control terminal to an abnormality detection voltage when an abnormal state is detected by the abnormality detection circuit.

10 Claims, 9 Drawing Sheets

| FIRST ABNORMAL STATE | ABNORMALITY IN NON-VOLATILE MEMORY | FIRST VOLTAGE |
| --- | --- | --- |
| SECOND ABNORMAL STATE | ABNORMALITY IN EXTERNAL POWER SOURCE VOLTAGE | SECOND VOLTAGE |
| THIRD ABNORMAL STATE | ABNORMALITY IN REGULATED POWER SOURCE VOLTAGE | THIRD VOLTAGE |
| FOURTH ABNORMAL STATE | ABNORMALITY IN PROCESSING CIRCUIT | FOURTH VOLTAGE |
| ⋮ | ⋮ | ⋮ |

OSCILLATOR, ELECTRONIC DEVICE, AND VEHICLE

The present application is based on, and claims priority from, JP Application Serial Number 2018-130437, filed Jul. 10, 2018, the disclosure of which is hereby incorporated by reference herein in its entirety.

BACKGROUND

1. Technical Field

The present disclosure relates to an oscillator, an electronic device, a vehicle, and the like.

2. Related Art

In the related art, there are known oscillators such as an SPXO (Simple Packaged Crystal Oscillator), a TCXO (Temperature Compensated Crystal Oscillator), and an OCXO (Oven Controlled Crystal Oscillator). The technique disclosed in JP-A-2012-147171 is an example of the related art in which an abnormal state of an oscillation circuit of an oscillator is diagnosed. A diagnosis circuit of JP-A-2012-147171 diagnoses a frequency range of an oscillation frequency at which a frequency changes according to a control signal. Specifically, the diagnosis circuit receives the control signal, compares a comparison value which is a value based on the control signal and a predetermined limit value to each other, and generates a diagnosis output value based on the comparison result.

When an abnormal state is detected in an oscillator, there is a case in which an external device to the oscillator is to be notified of the fact that an abnormal state is detected. However, it is difficult to provide many terminals for external connection on the oscillator in accordance with a demand for minimization of devices in recent years and the number of terminals is limited. Therefore, there is a problem in that it is necessary to perform notification of an abnormal state using a limited number of terminals.

SUMMARY

An advantage of some aspects of the present disclosure is to solve at least a part of the problems described above, and the present disclosure can be implemented as the following aspects.

An aspect of the present disclosure relates to an oscillator including a resonator, a circuit device which is electrically connected to the resonator and generates a clock signal, a control terminal which is electrically connected to the circuit device, and an output terminal which is electrically connected to the circuit device and outputs the clock signal, in which the circuit device includes an abnormality detection circuit, and the circuit device sets a potential of the control terminal to an abnormality detection voltage when an abnormal state is detected by the abnormality detection circuit.

DESCRIPTION OF EXEMPLARY EMBODIMENTS

Hereinafter, a detailed description will be given of a favorable embodiment of the present disclosure. The present embodiment described hereinafter is not to be wrongfully construed as limiting the content of the present disclosure described in the appended claims and not all of the configurations described in the embodiment are necessary solutions for the present disclosure.

1. Oscillator

Figure 1:
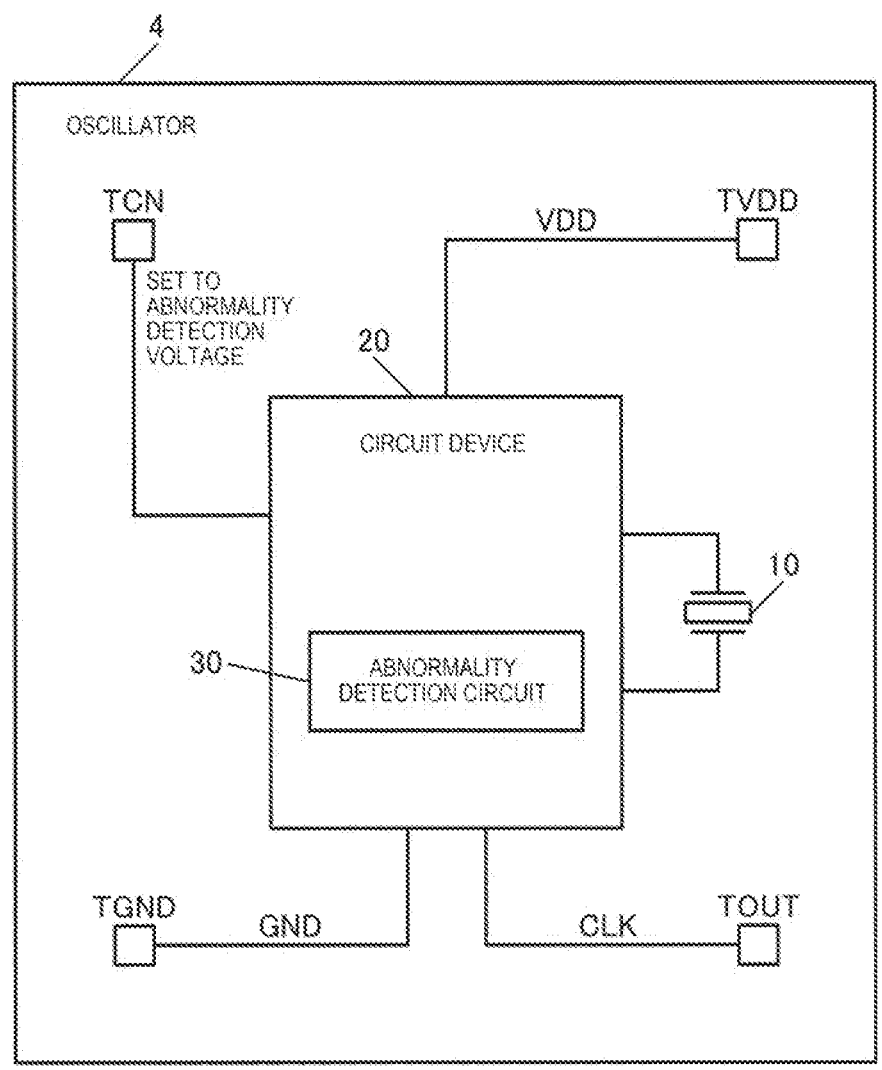
FIG. 1 is a configuration example of an oscillator of the present embodiment.

FIG. 1 illustrates a configuration example of an oscillator 4 of the present embodiment. The oscillator 4 includes a resonator 10, a circuit device 20, an output terminal TOUT, and a control terminal TCN. The oscillator 4 may include a power source terminal TVDD and a ground terminal TGND. FIG. 1 is an example of a four-terminal oscillator 4 in which the number of terminals is 4. The number of terminals may be greater than or equal to 5, for example, the oscillator 4 may be a six-terminal oscillator 4 or the like.

Figure 10:
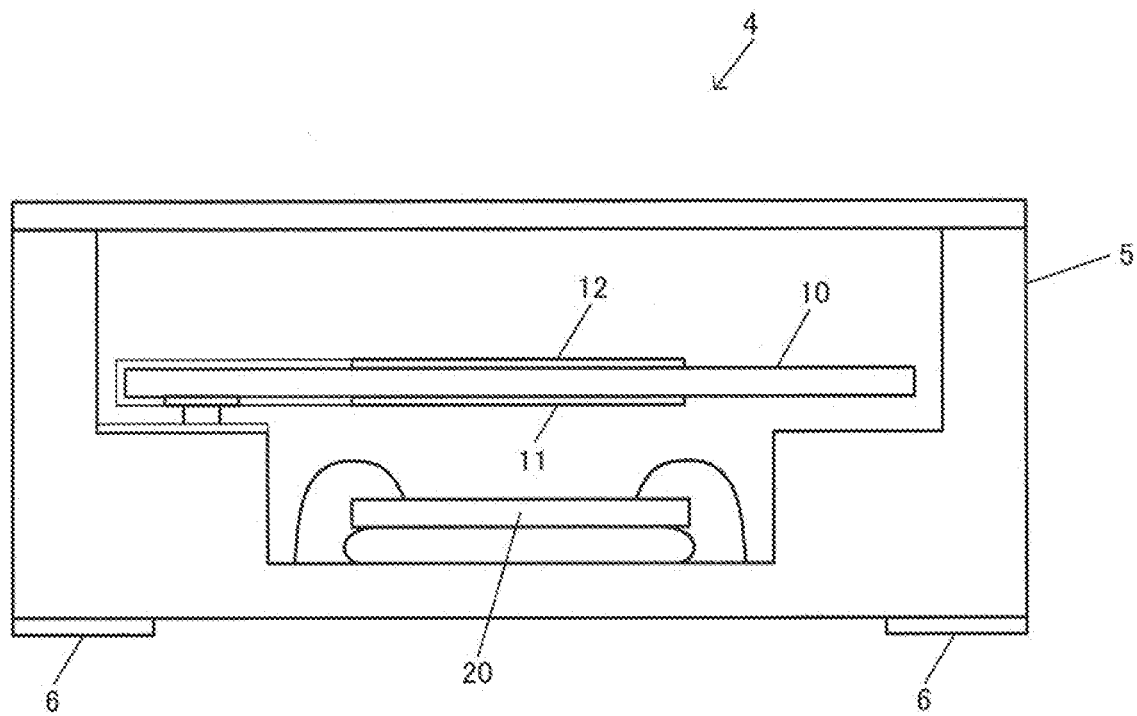
FIG. 10 is an example of a structure of the oscillator.

The power source terminal TVDD, the ground terminal TGND, the output terminal TOUT, and the control terminal TCN are terminals for external connection on the oscillator 4 and may be realized using terminals 6 which are formed on a bottom surface of a package 5 of the oscillator 4, as illustrated in FIG. 10 (described later), for example.

The power source terminal TVDD is a terminal for supplying a high potential side power source voltage VDD to the oscillator 4. The ground terminal TGND is a terminal for supplying GND, which is a ground potential, to the oscillator 4. The GND is 0 V, for example. The output terminal TOUT is a terminal for outputting a clock signal CLK. The control terminal TCN is the control terminal of the oscillator 4. For example, the control terminal TCN is an output control terminal of the clock signal CLK and is an output-enable terminal of the clock signal CLK. For example, when the control terminal TCN is set to an H level, the clock signal CLK is output from the output terminal TOUT, and when the control terminal TCN is set to an L level, the output terminal TOUT is set to a high-impedance state. In this case, the control terminal TCN is pulled up in the inner portion of the circuit device 20, for example. Alternatively, the control terminal TCN may be a frequency control terminal of the clock signal CLK. For example, a frequency control voltage is inputted to the control terminal TCN from the external device and the frequency of the clock signal CLK is variably controlled based on the control voltage that is inputted.

The power source terminal TVDD, the ground terminal TGND, the output terminal TOUT, and the control terminal TCN are electrically connected to the circuit device 20. The terminals are connected to the circuit device 20 via internal wiring, metal bumps, or the like of the package 5 of the oscillator 4 of FIG. 10 (described later). It should be noted that the connection in the present embodiment is an electrical connection. An electrical connection may be an electrical signal being connected so as to be transmittable, may be a connection in which the transmission of information according to an electrical signal is possible, and may be a connection which is made via signal lines, active elements, and the like.

The resonator 10 is an element which generates mechanical vibrations according to an electrical signal. The resonator 10 may be realized using a resonator element such as a quartz crystal resonator element, for example. For example, it is possible to realize the resonator 10 using a quartz crystal resonator element which undergoes thickness-shear vibration in which the cut angle is AT cut, SC cut, or the like. For example, the resonator 10 may be a resonator which is embedded in a TCXO (temperature compensated oscillator) not provided with a thermostat, may be a resonator which is embedded in an OCXO (Oven-Controlled Crystal Oscillator) provided with a thermostat, or the like. The resonator 10 may be an SPXO resonator. It is possible to realize the resonator 10 of the present embodiment using a resonator element other than one of a thickness-shear vibration type, and various resonator elements such as a piezoelectric resonator element which is formed by a material other than quartz crystal, for example. For example, a SAW (Surface Acoustic Wave) resonator, a MEMS (Micro Electro Mechanical Systems) resonator which serves as a silicon resonator which is formed using a silicon substrate, or the like may be adopted for the resonator 10.

The circuit device 20 is an IC (Integrated Circuit), which is manufactured using a semiconductor process, and is a semiconductor chip in which circuit elements are formed on a semiconductor substrate. The circuit device 20 is electrically connected to the resonator 10, the control terminal TCN, and the output terminal TOUT. The circuit device 20 is electrically connected to the power source terminal TVDD and the ground terminal TGND. The circuit device 20 generates the clock signal CLK using the resonator 10. For example, the circuit device 20 causes the resonator 10 to oscillate to generate an oscillation signal and generates and outputs the clock signal CLK based on the generated oscillation signal. For example, the circuit device 20 includes an oscillation circuit 80 such as the one in FIG. 2 (described later) and generates an oscillation signal OSCK using the oscillation circuit 80 to generate the clock signal CLK. The output terminal TOUT is connected to the circuit device 20 and outputs the clock signal CLK which is generated by the circuit device 20. In other words, the output terminal TOUT outputs the generated clock signal CLK to the external device.

In the present embodiment, when the circuit device 20 detects an abnormal state, the circuit device 20 sets the potential of the control terminal TCN to an abnormality detection voltage. Specifically, the circuit device 20 includes an abnormality detection circuit 30, and when an abnormal state is detected by the abnormality detection circuit 30, the circuit device 20 sets the potential of the control terminal TCN to the abnormality detection voltage. For example, the circuit device 20 outputs the abnormality detection voltage to the control terminal TCN and sets the voltage level of the control terminal TCN to the voltage level of the abnormality detection voltage. The abnormality detection circuit 30 is a fault detection circuit, for example. The abnormal state is a state in which the operation or the like of the oscillator 4 is abnormal, for example, a state in which there is a fault in the oscillator or the like. For example, the abnormal state is an operation state which differs from the ordinary operation state of the oscillator 4 (an operation state falling outside of specification). The abnormality detection circuit 30 monitors the operation state, the signal line state, or the like of the circuits included in the circuit device 20 and detects whether or not the circuit device 20 is in an abnormal state. When an abnormal state is detected, the circuit device 20 sets the potential of the control terminal TCN to the abnormality detection voltage. For example, the circuit device 20 sets the voltage level of the control terminal TCN to the voltage level of the abnormality detection voltage which is a different voltage level from the ordinary state.

Accordingly, the external device of the oscillator 4 is capable of detecting that the oscillator 4 is in an abnormal state such as having a fault by monitoring the voltage level (the potential) of the control terminal TCN.

In other words, in a case in which the control terminal TCN assumes the voltage level of the abnormality detection voltage which is different from the voltage level of the ordinary state, the external device determines that the oscillator 4 is in the abnormal state. Accordingly, even if a new terminal for detection of an abnormal state is not provided on the oscillator 4, it is possible to detect an abnormal state. Therefore, an external device such as a host device becomes capable of detecting an abnormal state such as a fault inside the oscillator 4 with a limited number of terminals of the oscillator 4 such as four terminals or six terminals and an improvement may be obtained in the reliability and the like while maintaining the compactness of the oscillator 4. Hereinafter, the description will mainly be carried out with the premise that the external device is a host device such as a microcomputer. Hereinafter, setting the potential of the control terminal TCN to the abnormality detection voltage will be described, as appropriate, simply as setting the control terminal TCN to the abnormality detection voltage.

In the present embodiment, notification of the abnormal state is performed by the control terminal TCN being set to the abnormality detection voltage. For example, in a case in which the control terminal TCN is an output control terminal of the clock signal CLK, there are many cases in which the control terminal TCN is pulled up in the inner portion of the circuit device 20. Specifically, the control terminal TCN is pulled up by a voltage setting circuit 40 which is a pull-up circuit of FIG. 2 (described later). For example, in a use-case such as one in which the clock signal CLK of the oscillator 4 is always set to an output-enabled state, instead of setting the control terminal TCN to the H level using the host device which is the external device, the control terminal TCN is set to a pull-up voltage which is the H level in the inner portion of the circuit device 20. Therefore, since the control terminal TCN need not be used as an input terminal in this case, it is possible to notify the host device of the abnormal state of the oscillator 4 using the control terminal TCN. In other words, the host device is notified of the abnormal state of the oscillator 4 by setting the control terminal TCN to the abnormality detection voltage during the detection of the abnormal state. Alternatively, the control terminal TCN is assumed to be a frequency control terminal. In this case, in a use-case such as one in which the frequency of the clock signal CLK is not variably controlled using the control voltage of the frequency, there is a case in which the control terminal TCN is treated as an NC pin (Non-Connection pin). Even in this case, according to the present embodiment, it is possible to use the control terminal TCN, which is treated as the NC pin in this manner, to notify the host device of the abnormal state of the oscillator 4. In other words, the control terminal TCN is not connected to the circuit for controlling the frequency (described later), and instead, the host device is notified of the abnormal state of the oscillator 4 by setting the control terminal TCN to the abnormality detection voltage during the detection of the abnormal state. Therefore, according to the present embodiment, in a case in which the control terminal TCN is not used as an input terminal, a case in which the control terminal TCN is treated as the NC pin, or the like, it is possible to make effective use of the control terminal TCN to notify the host device of the abnormal state of the oscillator 4. Therefore, it is possible to appropriately detect and perform notification of the abnormal state of the oscillator 4 having a limited number of terminals, and an improvement may be obtained in the reliability and the convenience of the oscillator 4.

Figure 2:
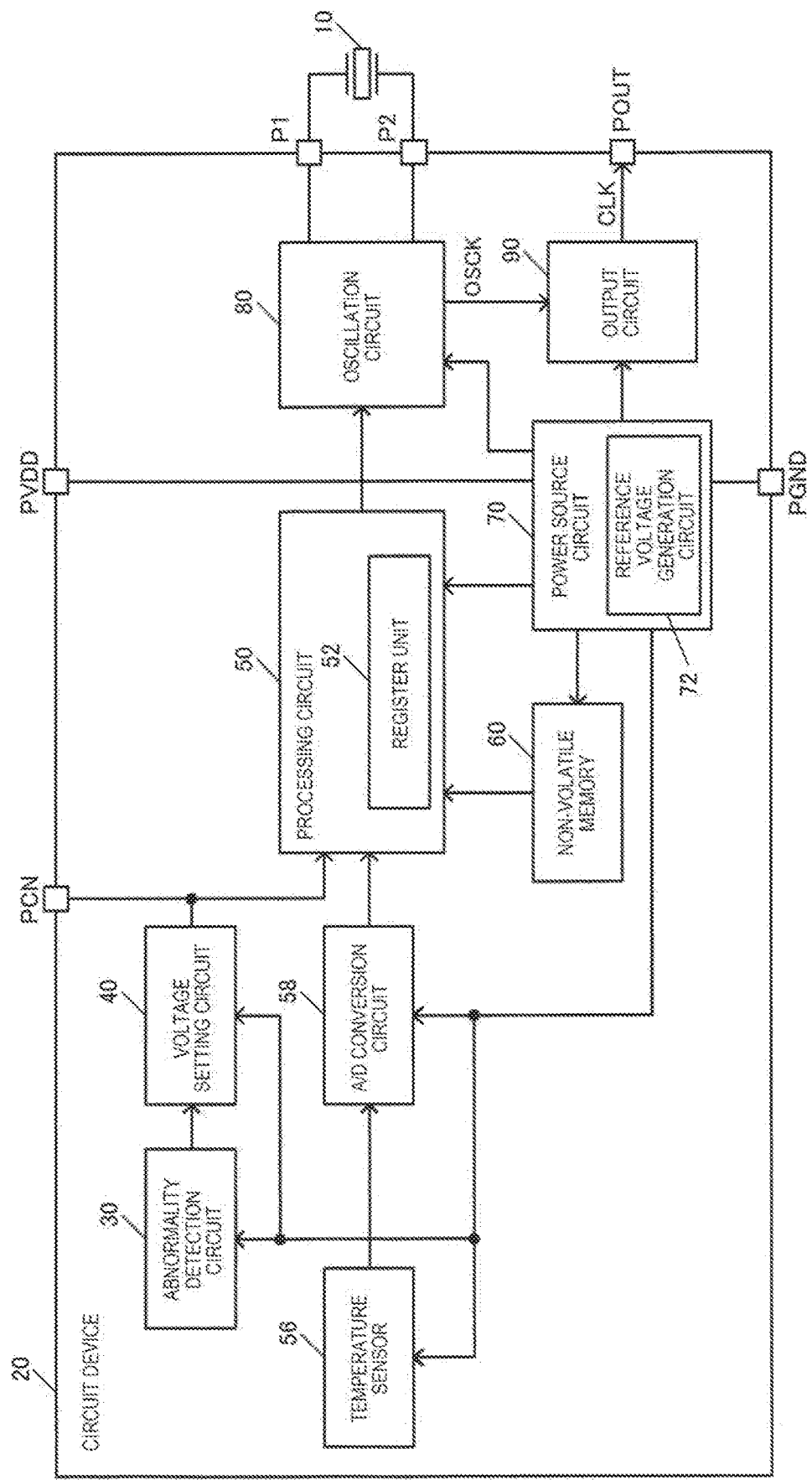
FIG. 2 is a detailed configuration example of a circuit device.

FIG. 2 illustrates a detailed configuration example of the circuit device 20. The circuit device 20 includes the abnormality detection circuit 30, the voltage setting circuit 40, a processing circuit 50, the oscillation circuit 80, and an output circuit 90. The circuit device may further include a temperature sensor 56, an A/D conversion circuit 58, a non-volatile memory 60, and a power source circuit 70. The circuit device 20 includes terminals PVDD, PGND, POUT, PCN, P1, and P2. The terminals are realized using pads of an IC which is the circuit device 20, for example. The terminals PVDD, PGND, POUT, and PCN of the circuit device 20 are connected to the power source terminal TVDD, the ground terminal TGND, the output terminal TOUT, and the control terminal TCN of the oscillator 4 of FIG. 1, respectively. The terminals P1 and P2 are terminals for the connection of the resonator 10, one end of the resonator 10 is connected to the terminal P1, and the other end of the resonator 10 is connected to the terminal P2. The connections between the resonator 10 and the terminals P1 and P2 of the circuit device 20 may be connections which are made by conductive bumps such as metal bumps. The circuit device 20 is not limited to the configuration of FIG. 2, and various modifications to the embodiment such as omitting a portion of the configuration elements and adding other configuration elements are possible.

The voltage setting circuit 40 is a circuit which performs the voltage setting of the control terminal TCN. For example, the voltage setting circuit 40 sets the control terminal TCN which is connected to the terminal PCN to the pull-up voltage which is a fixed voltage. In a case in which an abnormal state of the oscillator 4 is detected by the abnormality detection circuit 30, the voltage setting circuit 40 changes the set voltage of the control terminal TCN from the pull-up voltage which is a fixed voltage to the abnormality detection voltage. A detailed description will be given of the voltage setting circuit 40 in FIG. 3 (described later).

The processing circuit 50 is a circuit which performs various processes such as digital signal processing. For example, the processing circuit 50 performs digital signal processing such as temperature compensation processing, aging compensation processing, and digital filter processing. For example, it is possible to realize the processing circuit 50 using a processor such as a DSP (Digital Signal Processor) or a CPU (Central Processing Unit), and it is possible to realize the processing circuit using a circuit such as an ASIC (Application Specific Integrated Circuit) which uses automatic placement and routing such as a gate array. For example, the processing circuit 50 may perform various digital signal processing using a program which runs on a processor.

The processing circuit 50 includes a register unit 52. The register unit 52 holds various data such as coefficient data and operation parameters for operating the circuit device 20. For example, the processing circuit 50 loads the various data such as temperature compensation coefficient data which is stored in the non-volatile memory 60 into the register unit 52 and performs various processes based on the data which is loaded into the register unit 52.

The temperature sensor 56 outputs a temperature-dependent voltage, which changes according to the temperature of the environment, as a temperature detection voltage. The temperature of the environment is, for example, the temperature of the environment in the periphery of the circuit device 20 or the resonator 10.

For example, the temperature sensor 56 generates the temperature-dependent voltage using a circuit element having temperature dependence and outputs the temperature-dependent voltage using a voltage which is not temperature-dependent as a reference. For example, the temperature sensor 56 outputs a forward voltage of a PN junction as the temperature-dependent voltage. The voltage which is not temperature-dependent is a bandgap reference voltage or the like, for example.

The A/D conversion circuit 58 subjects the temperature detection voltage from the temperature sensor to A/D conversion and outputs digital temperature detection data. It is possible to adopt a sequential comparison method, a method similar to the sequential comparison method, or the like, for example, as the A/D conversion method of the A/D conversion circuit 58. A delta-sigma type, a flash type, a pipeline type, a double integral type, or the like may be adopted for the A/D conversion method.

The processing circuit 50 performs a temperature compensation process based on the temperature detection data from the A/D conversion circuit 58 and temperature compensation coefficient data. For example, the processing circuit 50 performs the temperature compensation process which compensates the temperature characteristics of the oscillation frequency and outputs frequency control data for controlling the oscillation frequency.

Specifically, the processing circuit 50 performs the temperature compensation process for canceling or suppressing fluctuations in the oscillation frequency caused by temperature changes based on the temperature detection data which changes according to the temperature and the temperature compensation coefficient data which is a coefficient of approximation. In other words, in a case in which temperature changes are present, the temperature compensation process for rendering the oscillation frequency fixed is performed.

The non-volatile memory 60 is a non-volatile memory device and is a device capable of holding and storing data even if a power source is not supplied. The non-volatile memory 60 includes a memory cell array, a driver circuit, a read-write circuit, and the like. A plurality of memory cells, a plurality of word lines, a plurality of bit lines, a plurality of source lines, and the like are disposed in the memory cell array, the driver circuit performs word line selection and the like to perform driving of the word lines and the source lines, and the read-write circuit is connected to the bit lines and performs the reading and the writing of data. The non-volatile memory 60 is EEPROM (Electrically Erasable Programmable Read Only Memory), flash memory, or the like, for example. It is possible to realize the EEPROM using floating gate type memory cells or the like, for example. It is possible to realize the flash memory using MONOS (Metal-Oxide-Nitride-Oxide-Silicon) memory cells or the like, for example. Alternatively, the non-volatile memory 60 may be a memory which uses fuse cells. In this type of memory, a fuse cell which is a memory cell includes a resistance element and a selector element which is connected in series to the resistance element. The selector element is a PN junction diode, for example. However, the selector element may be a MOS transistor. For example, one end of the resistance element is connected to the bit line and the other end of the resistance element is connected to the anode of the diode. The cathode of the diode is connected to the word line. The resistance element which functions as a fuse element is a programmable resistance in which the resistance value is variable. For example, the resistance element includes a polysilicon resistor having a high resistance value and silicide which is formed on the top layer of the polysilicon resistor and has a low resistance value. Data is stored in a fuse cell which is a memory cell by melting the silicide by causing a large current to flow in the silicide to change the resistance value of the resistance element from a low resistance value to a high resistance value.

The power source circuit 70 generates various power source voltages based on the power source voltage VDD which is supplied via the power source terminal TVDD and based on GND which is the ground potential which is supplied via the ground terminal TGND and supplies the various power supply voltages to each circuit of the circuit device 20. For example, power source voltages which are generated by regulating the power source voltage VDD using regulators are supplied to each circuit. The power source circuit 70 includes a reference voltage generation circuit 72 which generates a reference voltage. The reference voltage generation circuit 72 generates the reference voltage in which the voltage is fixed even if VDD changes. For example, the reference voltage generation circuit 72 generates the reference voltage by using a work function difference or the like of a transistor. The reference voltage generation circuit 72 may generate the reference voltage using a bandgap reference circuit.

Figure 9:
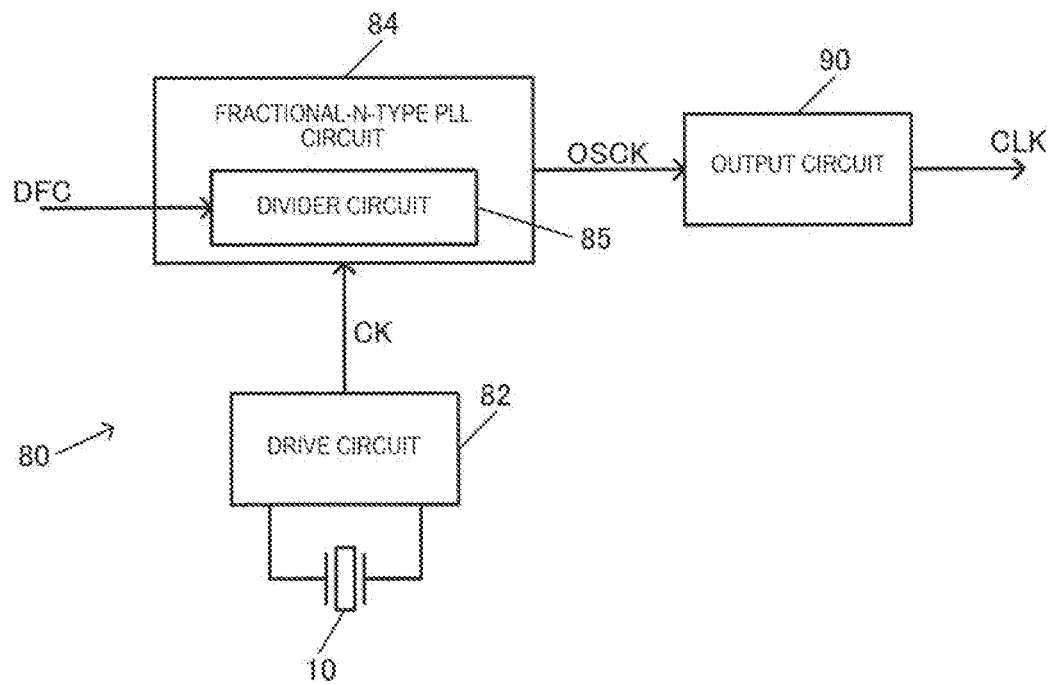
FIG. 9 is a second configuration example of the oscillation circuit.

The oscillation circuit 80 causes the resonator 10 to oscillate to generate the oscillation signal OSCK. For example, the oscillation circuit 80 which is an oscillation signal generation circuit performs the driving of the resonator 10 to generate the oscillation signal OSCK. For example, the oscillation circuit 80 includes a D/A conversion circuit and a VCO (Voltage Control Oscillator), and the D/A conversion circuit performs D/A conversion of the frequency control data which is a frequency control code from the processing circuit 50 to output the control voltage. The VCO includes a variable-capacitance capacitor such as a varicap in which the capacitance value changes according to the control voltage and causes the resonator 10 to resonate at an oscillation frequency corresponding to the control voltage. Accordingly, the oscillation signal OSCK of the oscillation frequency which corresponds to the frequency control data is generated. The oscillation circuit 80 may be a digital oscillation circuit which uses a fractional-N-type PLL circuit 84 or the like as illustrated in FIG. 9 (described later).

The output circuit 90 performs buffering of the oscillation signal OSCK from the oscillation circuit 80 and outputs the clock signal CLK of a frequency corresponding to the oscillation frequency of the oscillation signal OSCK. The output circuit 90 may output a CMOS (Complementary Metal Oxide Semiconductor) clock signal CLK and may output a clipped sine wave clock signal CLK. The output circuit 90 may output the clock signal CLK of a differential signal such as LVDS (Low Voltage Differential Signaling) or PECL (Positive ECL). In this case, two output terminals may be provided, as in a first signal output terminal and a second signal output terminal which configure the clock signal of a differential signal.

Figure 3:
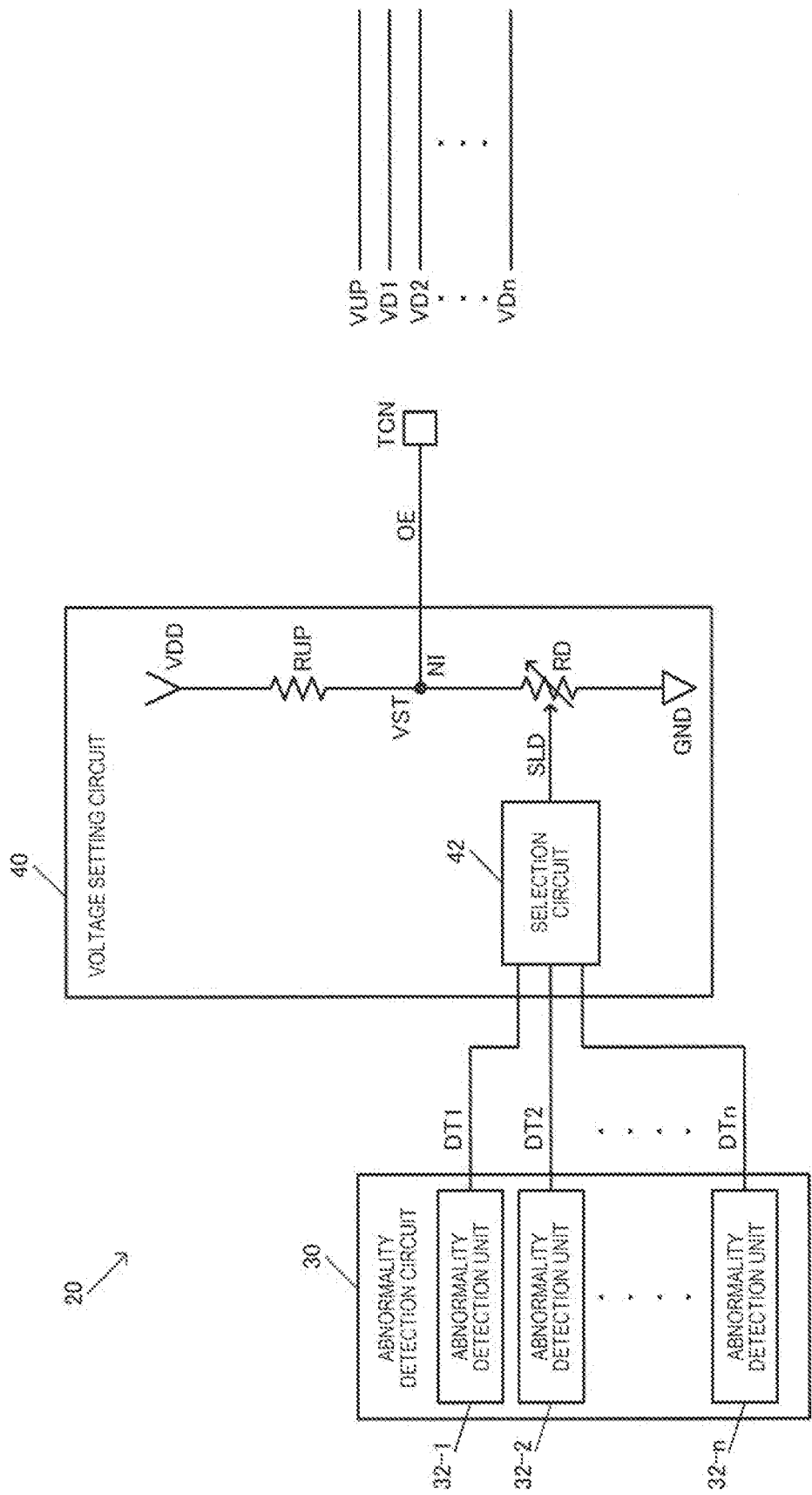
FIG. 3 is a configuration example of a voltage setting circuit and an abnormality detection circuit.

When an abnormal state is detected by the abnormality detection circuit 30, the circuit device 20 of the present embodiment changes the set voltage of the control terminal TCN from the pull-up voltage to the abnormality detection voltage. FIG. 3 illustrates a specific configuration example of the circuit device 20 of this case. For example, the voltage setting circuit 40 in FIG. 3 changes the set voltage of the control terminal TCN from the pull-up voltage to the abnormality detection voltage. In the present embodiment, the control terminal TCN is an output control terminal of the clock signal CLK, for example. In this case, the host device which is the external device inputs an output-enable signal OE to the control terminal TCN of the circuit device 20. When the host device sets the output-enable signal OE to the H level, the clock signal CLK is output from the output terminal TOUT. Meanwhile, when the host device sets the output-enable signal OE to the L level, the clock signal CLK is not output from the output terminal TOUT and the output terminal TOUT is set to a high-impedance state, for example.

Here, in a system such as one in which the clock signal CLK of the oscillator 4 is always set to an output-enabled state, it is wasteful for the host device to input the output-enable signal OE to the control terminal TCN. Therefore, in order to handle such a system, the voltage setting circuit 40 sets the control terminal TCN to the pull-up voltage to set the control terminal TCN to a pulled-up state. Accordingly, even if the host device does not input the output-enable signal OE of the H level to the control terminal TCN, the clock signal CLK is output from the output terminal TOUT due to the control terminal TCN being set to the pull-up voltage which is the H level.

In the present embodiment, in a case in which an abnormal state is detected by the abnormality detection circuit 30, the set voltage of the control terminal TCN is changed from the pull-up voltage to the abnormality detection voltage. For example, in a case in which the pull-up voltage is VUP and the abnormality detection voltage is VD, the relationship VUP>VD is satisfied. The VUP which is the pull-up voltage is a voltage which is extremely close to VDD, for example. For example, in the present embodiment, a buffer circuit (not illustrated) to which the output-enable signal OE is inputted via the control terminal TCN is provided in the processing circuit 50. In a case in which a threshold voltage for distinguishing the L level from the H level of the input signal in the buffer circuit is VTH, the relationship VUP>VD>VTH is satisfied. Therefore, since VD>VTH is true even if the abnormal state is detected and the control terminal TCN is set to the abnormality detection voltage, the buffer circuit distinguishes that the output-enable signal OE that is inputted is the H level. Therefore, the output-enable of the clock signal CLK is turned on and the ordinary clock signal CLK is output from the output terminal TOUT. Therefore, the host device is capable of monitoring the voltage level of the control terminal TCN while operating based on the clock signal CLK from the output terminal TOUT to detect an abnormal state of the oscillator 4. In other words, the host device is capable of operating based on the clock signal CLK which is supplied from the oscillator 4 and executing an appropriate process corresponding to the abnormal state.

Specifically, in the present embodiment, as illustrated in FIGS. 2 and 3, the circuit device 20 includes the abnormality detection circuit 30, the oscillation circuit 80, the output circuit 90, and the voltage setting circuit 40. The abnormality detection circuit 30 outputs abnormality detection signals DT1 to DTn, the oscillation circuit 80 causes the resonator 10 to oscillate to generate the oscillation signal OSCK, the output circuit 90 outputs the clock signal CLK based on the oscillation signal OSCK, and the voltage setting circuit 40 sets the control terminal TCN to the abnormality detection voltage VD based on the abnormality detection signals DT1 to DTn. The voltage setting circuit 40 changes the set voltage of the control terminal TCN from the pull-up voltage VUP to the abnormality detection voltage VD=VD1 to VDn based on the abnormality detection signals DT1 to DTn. For example, in a case in which the control terminal TCN is set to the pull-up voltage VUP by pulling up, the voltage setting circuit 40 changes the pull-up voltage VUP of the control terminal TCN to the abnormality detection voltage VD=VD1 to VDn based on the abnormality detection signals DT1 to DTn.

For example, in FIG. 3, the control terminal TCN is an output control terminal of the clock signal CLK and the host device is capable of inputting the output-enable signal OE to the control terminal TCN. In FIG. 3, the voltage setting circuit 40 includes a pull-up resistance RUP which is provided between the VDD node and the node NI to which the output-enable signal OE is inputted, a resistance RD which is provided between the node NI and the GND node and which has a variable resistance value, and a selection circuit 42. The selection circuit 42 receives input of the abnormality detection signals DT1 to DTn from the abnormality detection circuit 30 and outputs a selection signal SLD. The resistance value of the resistance RD changes based on the selection signal SLD. Due to the resistance value of the resistance RD changing in this manner, a set voltage VST of the control terminal TCN which is the voltage of the node NI is changed from the pull-up voltage VUP to the abnormality detection voltage VD=VD1 to VDn. In the present embodiment, the voltage setting circuit 40 includes the pull-up resistance RUP and the resistance RD which is a variable resistance which is connected to the pull-up resistance RUP. The voltage setting circuit 40 changes the resistance value of the resistance RD which is a variable resistance based on the abnormality detection signals DT1 to DTn, and thus, changes the pull-up voltage VUP to the abnormality detection voltage VD=VD1 to VDn.

Specifically, the abnormality detection circuit 30 in FIG. 3 includes abnormality detection units 32-1 to 32-n which are first to nth abnormality detection units. The abnormality detection units 32-1 to 32-n detect first to nth abnormal states. Here, n is an integer greater than or equal to two. The abnormality detection units 32-1 to 32-n may be disposed together in a predetermined circuit region of the circuit device 20 and may be disposed in a distributed manner on the circuit device 20. Each of the abnormality detection units among the abnormality detection units 32-1 to 32-n includes a circuit configuration for detecting each abnormal state of the first to the nth abnormal states. The abnormality detection units 32-1 to 32-n output the abnormality detection signals DT1 to DTn. The abnormality detection signals DT1 to DTn are the first to nth abnormality detection signals. Each of the abnormality detection signals among the abnormality detection signals DT1 to DTn is a signal which becomes active in a case in which the abnormal state is detected in each of the abnormality detection units among the abnormality detection units 32-1 to 32-n. The signal becoming active means assuming the H level in a case of positive logic and means assuming the L level in a case of negative logic.

Meanwhile, the resistance RD of the voltage setting circuit 40 is a variable resistance circuit and the resistance value of the resistance RD changes according to the selection signal SLD. For example, the variable resistance circuit which is the resistance RD includes a plurality of resistance elements and a plurality of switch elements which are provided to correspond to the plurality of resistance elements. Due to the switch elements turning on or off based on the selection signal SLD, the resistance value of the resistance RD changes. Due to the resistance value of the resistance RD changing, the set voltage VST of the control terminal TCN is changed from the pull-up voltage VUP to the abnormality detection voltage VD=VD1 to VDn.

For example, it will be assumed that the first abnormal state is detected by the abnormality detection unit 32-1 of the abnormality detection circuit 30 and DT1 which is the first abnormality detection signal is active. In this case, the resistance value of the resistance RD is changed by the selection signal SLD from the selection circuit 42 and the set voltage VST of the control terminal TCN is changed from the pull-up voltage VUP to the first abnormality detection voltage VD1. Here, for example, the relationship VUP>VD1 is satisfied. The resistance value of the resistance RD is a sufficiently high resistance value as compared to the resistance RUP. It will be assumed that the second abnormal state is detected by the abnormality detection unit 32-2 and DT2 which is the second abnormality detection signal is active. In this case, the resistance value of the resistance RD is changed by the selection signal SLD from the selection circuit 42 and the set voltage VST of the control terminal TCN is changed from the pull-up voltage VUP to the second abnormality detection voltage VD2.

Here, for example, the relationship VUP>VD1>VD2 is satisfied. Similarly, in a case in which the third to the nth abnormal states are detected by the abnormality detection units 32-3 to 32-n, the set voltage VST of the control terminal TCN is changed from the pull-up voltage VUP to the third to the nth abnormality detection voltages VD3 to VDn. Here, for example, the relationship VUP>VD1>VD2 . . . >VDn is satisfied. In a case in which the threshold voltage of the buffer circuit, in which the node NI is connected to the input terminal of the buffer circuit, is VTH, the relationship VUP>VD1>VD2 . . . >VDn>VTH is satisfied. Accordingly, in a case in which the first to the nth abnormal states are detected by the abnormality detection circuit 30, the set voltage VST of the control terminal TCN is set to the first to the nth abnormality detection voltages VD1 to VDn corresponding to the first to the nth abnormal states. Therefore, due to the host device which is the external device monitoring the set voltage VST of the control terminal TCN, it is possible to distinguish which of the abnormal states of the first to the nth abnormal states is detected.

The relationship VUP>VD1>VD2 . . . >VDn>VTH is satisfied for the pull-up voltage, the abnormality detection voltage, and the threshold voltage. Therefore, even if the set voltage VST of the control terminal TCN is changed from the pull-up voltage VUP to the abnormality detection voltage VD=VD1 to VDn, the buffer circuit which is connected to the node NI distinguishes the set voltage VST as the H level which is the pull-up voltage. Therefore, the set voltage VST is pulled up by the control terminal TCN, assumes the same state as a state in which the clock signal CLK is set to output-enabled, and the clock signal CLK is output from the output terminal TOUT. Therefore, the host device is capable of monitoring the set voltage VST of the control terminal TCN while continuing to operate based on the clock signal CLK to detect an abnormal state of the oscillator 4. In FIG. 3, a description is given of a case in which the set voltage VST is changed from the pull-up voltage VUP to the abnormality detection voltage VD. However, an embodiment is also possible in which the set voltage VST is changed from a pull-down voltage to the abnormality detection voltage VD.

In this manner, in FIG. 3, when an abnormal state is detected, the set voltage VST of the control terminal TCN is changed from the pull-up voltage VUP to the abnormality detection voltage VD=VD1 to VDn. Accordingly, the host device which is the external device is capable of detecting an abnormal state such as a fault by monitoring the set voltage VST of the control terminal TCN. In this case, since the clock signal CLK is maintained in a state in which the clock signal CLK continues to be output as ordinary from the output terminal TOUT, the host device is capable of operating based on the clock signal CLK which is supplied from the oscillator 4 and is capable of executing an appropriate process corresponding to the abnormal state. In FIG. 3, the voltage setting circuit 40 sets the control terminal TCN to the abnormality detection voltage VD based on the abnormality detection signals DT1 to DTn. Accordingly, in a case in which an abnormal state is detected, it is possible to set the set voltage VST of the control terminal TCN to the abnormality detection voltage VD of the voltage level corresponding to the detected abnormal state and it is possible to appropriately notify the host device of the abnormal state.

Figure 4:
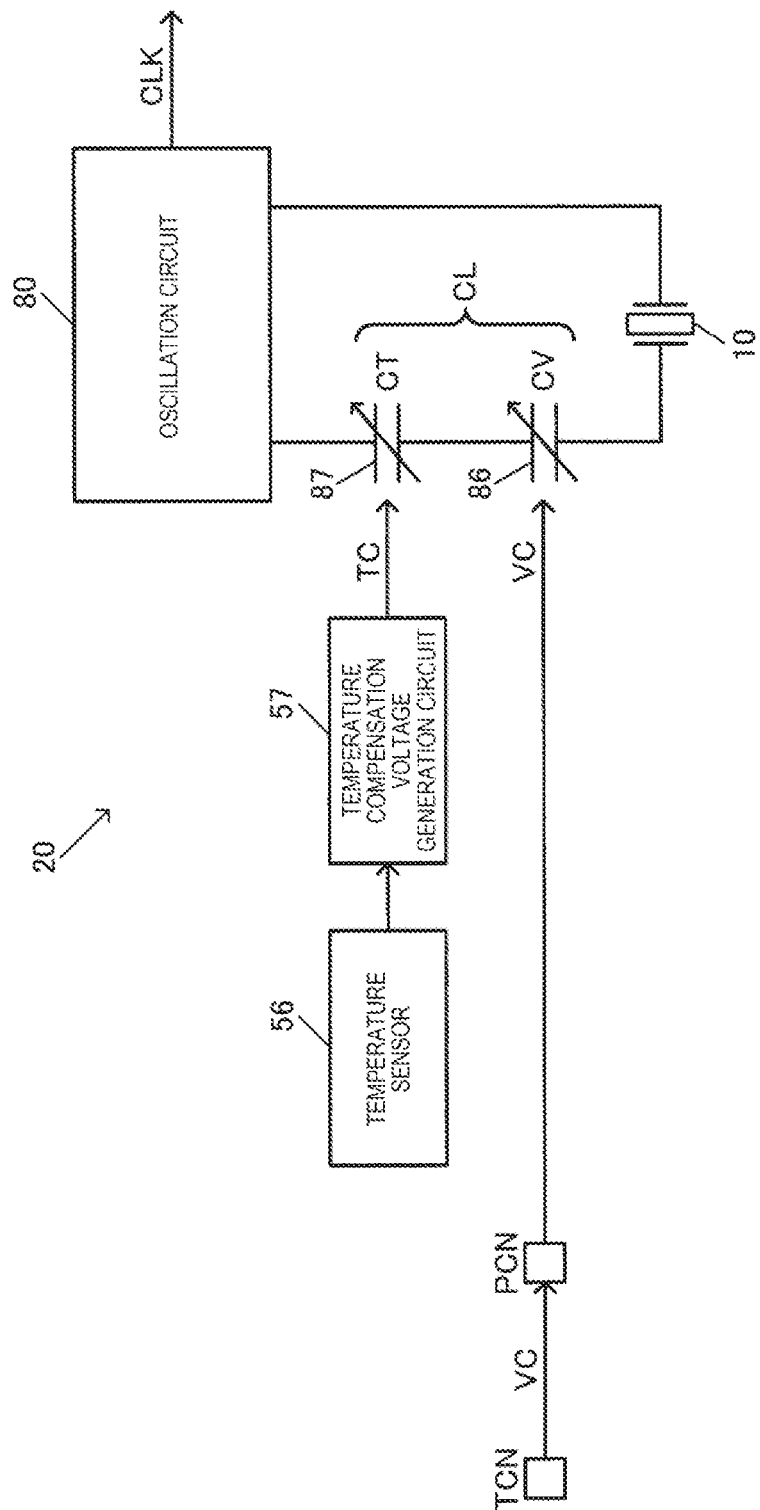
FIG. 4 is a first configuration example of the circuit device in a case in which a control terminal is a frequency control terminal.
Figure 5:
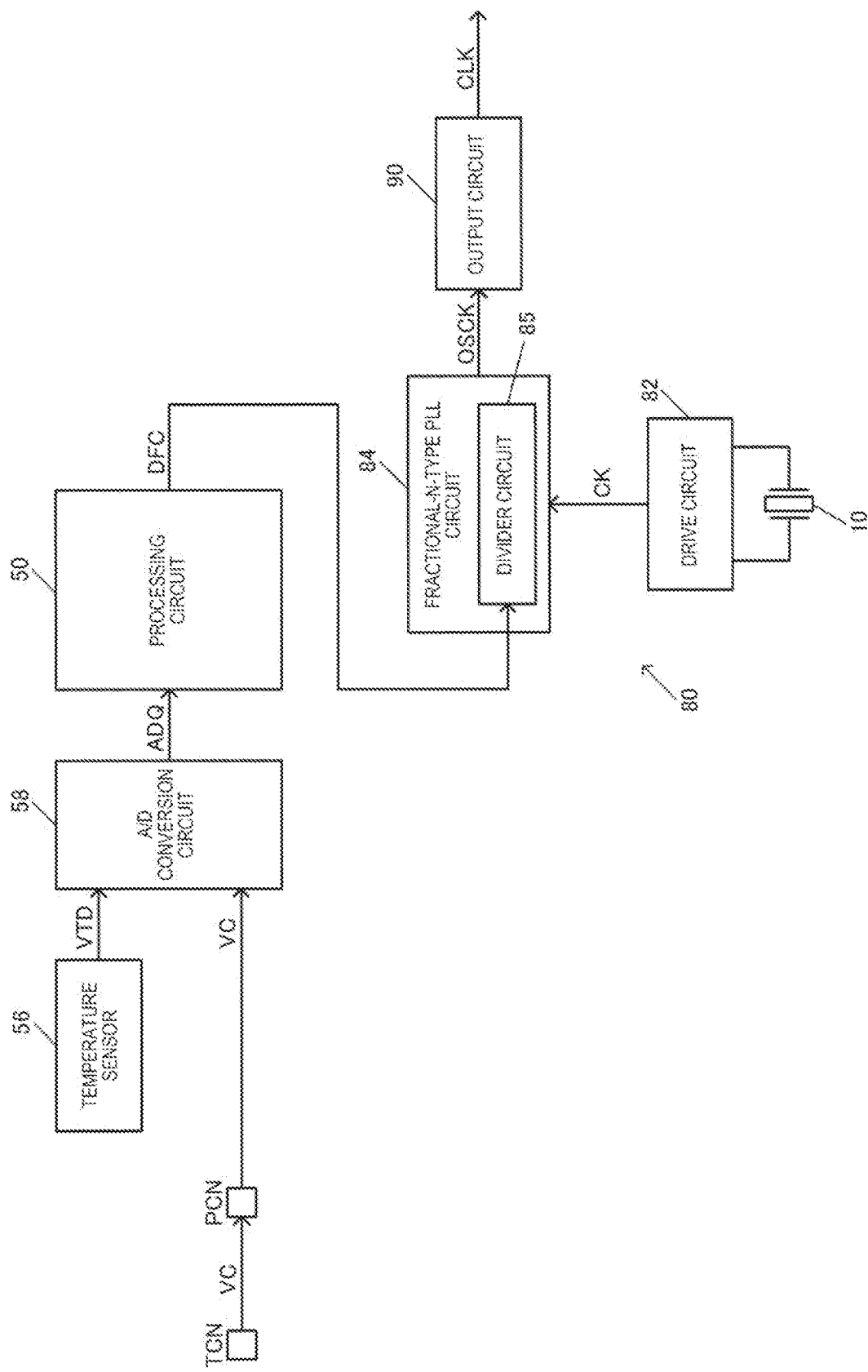
FIG. 5 is a second configuration example of a circuit device in a case in which a control terminal is a frequency control terminal.

Hereinabove, a description is mainly given exemplifying a case in which the control terminal TCN is an output control terminal of the clock signal CLK. However, the control terminal TCN may be a frequency control terminal of the clock signal CLK. FIGS. 4 and 5 are diagrams illustrating first and second configuration examples of the circuit device 20 in a case in which the control terminal TCN is a frequency control terminal. The control terminal TCN may be a terminal for setting the oscillator 4 to a standby state.

In the first configuration example of FIG. 4, the control voltage VC which is an analog voltage is inputted to the control terminal TCN and a capacitance CV of a variable-capacitance capacitor 86 is controlled based on the control voltage VC. A temperature compensation voltage generation circuit 57 outputs a temperature compensation voltage TC based on the temperature detection voltage from the temperature sensor 56 and a capacitance CT of a variable-capacitance capacitor 87 is controlled based on the temperature compensation voltage TC. Here, one end of the variable-capacitance capacitor 86 is connected to one end of the resonator 10 and the other end of the variable-capacitance capacitor 86 is connected to one end of the variable-capacitance capacitor 87. The other end of the variable-capacitance capacitor 87 is connected to the GND node, for example. For example, the variable-capacitance capacitors 86 and 87 are connected in series between one end of the resonator 10 and the GND node. The variable-capacitance capacitors 86 and 87 are realized using varactors which are variable-capacitance diodes.

In FIG. 4, the capacitances CV and CT of the variable-capacitance capacitors 86 and 87 assume a load capacitance CL of the oscillation circuit 80, the oscillation frequency of the resonator 10 is controlled according to the load capacitance CL, and the frequency of the clock signal CLK is controlled. Since the capacitance value of the load capacitance CL changes according to the control voltage VC, it is possible to control the frequency of the clock signal CLK based on the control voltage VC.

In the second configuration example of FIG. 5, the control voltage VC which is an analog voltage is inputted to the control terminal TCN and the control voltage VC is inputted to the A/D conversion circuit 58. A temperature detection voltage VTD from the temperature sensor 56 is also input to the A/D conversion circuit 58.

The A/D conversion circuit 58 subjects the control voltage VC to A/D conversion to generate the control voltage data. The A/D conversion circuit 58 subjects the temperature detection voltage VTD from the temperature sensor 56 to A/D conversion to generate the temperature detection data. The control voltage data and the temperature detection data are output from the A/D conversion circuit 58 as A/D conversion data ADQ. The A/D conversion circuit 58 may perform time sharing on the A/D conversion of the control voltage VC and the A/D conversion of the temperature detection voltage VTD. Alternatively, the A/D conversion circuit 58 may be provided with a first A/D converter and a second A/D converter, and the A/D conversion of the control voltage VC may be performed by the first A/D converter and the A/D conversion of the temperature detection voltage VTD may be performed by the second A/D converter.

The processing circuit 50 performs the temperature compensation process of the oscillation frequency based on the temperature detection data to generate frequency control data DFC of the oscillation frequency. Specifically, the processing circuit 50 generates temperature compensation data of the oscillation frequency based on the temperature detection data. The processing circuit 50 performs an addition process on the temperature compensation data and the control voltage data to generate frequency control data DFC of the oscillation frequency. The frequency control data DFC is also referred to as a frequency control code. In other words, the processing circuit 50 performs the temperature compensation process of the oscillation frequency based on the temperature detection data which is inputted from the A/D conversion circuit 58 as the A/D conversion data ADQ. The processing circuit 50 performs the addition process on the control voltage data which is inputted from the A/D conversion circuit 58 as the A/D conversion data ADQ and the temperature compensation data which is generated by the temperature compensation process. In other words, the processing circuit 50 performs a process of digitally adding the control voltage data and the temperature compensation data. The processing circuit 50 performs a compensation process or a conversion process, for example, on the addition result data of the addition process and outputs the frequency control data DFC after the compensation process or after the conversion process.

The frequency control data DFC from the processing circuit 50 is inputted to the oscillation circuit 80. The oscillation circuit 80 includes a drive circuit 82 which drives the resonator 10 to cause the resonator 10 to oscillate and the fractional-N-type PLL circuit 84, which includes a divider circuit 85. A detailed description will be given of the drive circuit 82 and the fractional-N-type PLL circuit 84 using FIG. 9 (described later). According to the oscillation circuit 80 of this configuration, the oscillation signal OSCK in which the frequency changes corresponding to the control voltage VC is generated and the output circuit 90 outputs the clock signal CLK based on the oscillation signal OSCK.

Accordingly, the clock signal CLK in which the frequency is controlled based on the control voltage VC is output from the output terminal TOUT.

In this manner, in FIGS. 4 and 5, the control terminal TCN is a frequency control terminal of the clock signal CLK. The frequency of the clock signal CLK is controlled based on the control voltage VC which is inputted to the control terminal TCN by the host device.

Meanwhile, depending on the system in which the oscillator 4 is installed, there are also systems which do not perform the frequency control based on the control voltage VC. Therefore, in a case in which the oscillator 4 is installed in such a system, the control terminal TCN is set as the NC pin and the frequency control by the control voltage VC does not function. Specifically, for example, setting data which sets the frequency control to enabled or disabled based on the control voltage VC is stored in the non-volatile memory 60 of FIG. 2. In a case in which the frequency control by the control voltage VC is set to enabled by the setting data, the frequency control is performed based on the control voltage VC due to the circuit device 20 performing the operations described in FIGS. 4 and 5. Meanwhile, in a case in which the frequency control by the control voltage VC is set to disabled by the setting data, the operation of the circuit device 20 is set so as not to perform the operation of the frequency control by the control voltage VC. For example, the processing circuit 50 of the circuit device 20 may be set not to receive the control voltage VC from the control terminal TCN or alternatively the control voltage VC is set to a predetermined fixed voltage. The setting of whether the frequency control by the control voltage VC is enabled or disabled may be realized by changing the aluminum mask during the manufacturing of the circuit device 20 or the like.

In the present embodiment, the control terminal TCN, which is treated as the NC pin in a case in which the frequency control by the control voltage VC is set to disabled, is used to perform notification of an abnormal state of the oscillator 4. In other words, when an abnormal state is detected by the abnormality detection circuit 30, the host device is notified of the abnormal state by setting the control terminal TCN to the abnormality detection voltage. Accordingly, in a case in which the frequency control by the control voltage VC is set to disabled, it is possible to make effective use of the control terminal TCN which is no longer necessary to appropriately notify the host device of an abnormal state of the oscillator 4.

In the present embodiment, the abnormality detection circuit 30 detects the first abnormal state and the second abnormal state which is different from the first abnormal state. When the first abnormal state is detected by the abnormality detection circuit 30, the circuit device 20 sets the abnormality detection voltage VD to the first voltage. For example, the abnormality detection voltage is set to VD=VD1. Meanwhile, when the second abnormal state is detected by the abnormality detection circuit 30, the circuit device 20 sets the abnormality detection voltage VD to the second voltage. For example, the abnormality detection voltage is set to VD=VD2.

Figures 6, 7:
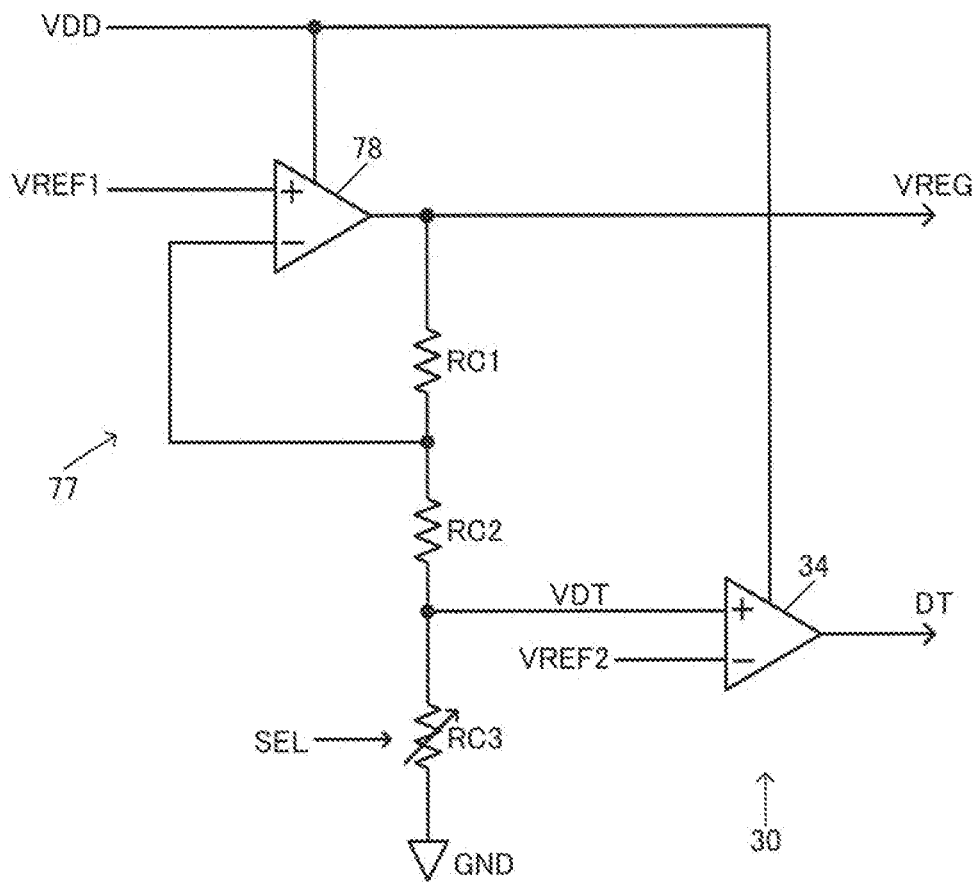
FIG. 6 is an explanatory diagram of a method of setting abnormality detection voltages corresponding to a plurality of abnormal states.
FIG. 7 is an explanatory diagram of a configuration example of the abnormality detection circuit.

For example, in FIG. 6, the first abnormal state is an abnormality of the non-volatile memory 60, and when the first abnormal state is detected, the abnormality detection voltage VD is set to the first voltage. For example, the voltage setting circuit 40 of FIGS. 2 and 3 sets the first voltage as the abnormality detection voltage VD which is set to the control terminal TCN. The second abnormal state is an abnormality of VDD which is an external power source voltage, for example, and when the second abnormal state is detected, the abnormality detection voltage VD is set to the second voltage.

For example, the voltage setting circuit 40 sets the second voltage as the abnormality detection voltage VD which is set to the control terminal TCN. A third abnormal state is an abnormality of a regulated power source voltage, for example, and a fourth abnormal state is an abnormality of the processing circuit 50, for example. Therefore, when the third or the fourth abnormal state is detected, the abnormality detection voltage VD is set to the third or the fourth voltage, respectively. Accordingly, due to the host device which is the external device determining the voltage level of the abnormality detection voltage VD which is set to the control terminal TCN, it is possible to determine which of the abnormal states the oscillator 4 is in among the plurality of abnormal states, and it is possible to execute the appropriate process corresponding to each of the abnormal states.

Here, the abnormality of the non-volatile memory is, for example, an abnormality of the data which is stored by the non-volatile memory 60, an abnormality in the operation of the non-volatile memory 60, or the like. Specifically, in a case in which there is an error in the data such as the temperature compensation coefficient which is stored by the non-volatile memory 60 and in a case in which there is an abnormality in the operation of the memory cells, the driver circuit, the read-write circuit, or the like of the non-volatile memory 60, the abnormality detection circuit 30 determines that the non-volatile memory 60 is in an abnormal state. For example, an error correction code such as an error detection code of parity or the like, a Hamming code, or a CRC (Cyclic Redundancy Check) is stored together with the data such as the temperature compensation coefficient in the memory cells of the non-volatile memory 60. The abnormality detection circuit 30 detects errors, or alternatively, corrects errors in the data which is stored in the memory cells based on the error detection code or the error correction code. Alternatively, a fault detection circuit of circuits such as memory cells, a driver circuit, and a read circuit is provided as the abnormality detection circuit 30 and faults caused by operation abnormalities of these circuits are detected.

Abnormalities in the external power source voltage are errors in the VDD which is the external power source voltage which is inputted via the power source terminal TVDD of FIG. 1. For example, the abnormality detection circuit 30 monitors the voltage level of VDD, and in a case in which the voltage level of VDD is less than or equal to a predetermined voltage level, for example, determines that the external power source voltage is in an abnormal state. An abnormality in a regulated power source voltage is an irregularity in VREG which is the power source voltage which is generated in a case in which the power source circuit 70 generates the power source voltage by regulating VDD which is the external power source voltage. For example, the abnormality detection circuit 30 monitors the voltage level of VREG, and in a case in which the voltage level of VREG is less than or equal to a predetermined voltage level, for example, determines that the regulated power source voltage is in an abnormal state. An abnormality in the processing circuit 50 is an abnormality in the register values of the register unit 52 of the processing circuit 50 or an abnormality in the operation state of the processing circuit 50.

For example, the processing circuit 50 controls the oscillation of the resonator 10 in the oscillation circuit 80 by generating the frequency control data and the abnormality detection circuit 30 detects an abnormality in the processing circuit 50 which performs the oscillation control. For example, the abnormality detection circuit 30 detects an abnormality in the register values by monitoring the register values of the register unit 52 and detecting whether or not there is an error in the register values. For example, an error detection code or an error correction code is stored together with the register values in the register unit 52. The abnormality detection circuit 30 detects errors, or alternatively, corrects errors in the register values which are stored in the register unit 52 based on the error detection code or the error correction code. In the present embodiment, the data of the register values which are stored in the non-volatile memory 60 is loaded into the register unit 52 and is held by the register unit 52. The register unit 52 is caused to perform a refresh operation in which the data of the register values are to be reloaded from the non-volatile memory 60. In this case, the abnormality detection circuit 30 may determine whether the data of the register values which are read from the non-volatile memory 60 match the data of the register values which are stored in the register unit 52 during the refresh operation, and in a case in which the data do not match, may determine that there is an abnormality in the register values.

FIG. 7 is an explanatory diagram of a configuration example of the abnormality detection circuit 30 in a case in which an abnormality is detected in VREG.

In FIG. 7, a regulator 77 is configured by an operational amplifier 78 and resistances RC1, RC2, and RC3. In the operational amplifier 78, VDD is supplied as the power source voltage and a reference voltage VREF is inputted to a non-inverted input terminal. An inverted input terminal of the operational amplifier 78 receives an input of a voltage which is obtained by voltage dividing VREG using the resistance RC1 and the resistances RC2 and RC3. It is possible to generate VREG which is the power source voltage in which VDD, which is the external power source voltage, is regulated by using the regulator 77 of this configuration.

The abnormality detection circuit 30 includes a comparator 34 which is realized by an operational amplifier.

The inverted input terminal of the comparator 34 receives an input of a reference voltage VREF2. VREF2 is a reference voltage of a different voltage level from VREF1. The non-inverted input terminal of the comparator 34 receives an input of a voltage VDT which is obtained by voltage dividing VREG using the resistances RC1 and RC2 and the resistance RC3. When the voltage level of VREG drops and VDT<VREF2, an output signal DT of the comparator 34 becomes active and an abnormality is detected in VREG which is the regulated power source voltage.

In FIG. 7, the resistance RC3 is a variable resistance and the resistance value of the resistance RC3 changes based on a selection signal SEL. Therefore, by causing the resistance value of the resistance RC3 to change using the selection signal SEL, it is possible to cause the voltage level which detects an abnormality in VREG to variably change.

As described above, in the present embodiment, the abnormality detection circuit 30 detects at least one of an abnormality in VDD which is the external power source voltage which is inputted via the power source terminal TVDD, an abnormality in VREG which is the power source voltage which is generated by regulating the external power source voltage, and an abnormality in the processing circuit 50 which performs the process of oscillation control. For example, the host device which is the external device is capable of detecting that the voltage level of VDD or VREG decreases and the oscillator 4 stops operating correctly due to the abnormality detection circuit 30 detecting abnormalities in the voltage levels of VDD and VREG. The host device which is the external device is capable of detecting abnormalities in the oscillation control of the resonator 10 caused by the processing circuit 50 not operating correctly due to the abnormality detection circuit 30 detecting an abnormality in the processing circuit 50. Accordingly, the host device is capable of detecting an abnormal state of the oscillator 4 and executing the appropriate process for handling the abnormal state.

The circuit device 20 of the present embodiment includes the non-volatile memory 60 which stores data of the temperature compensation coefficient of the frequency of the clock signal CLK. The abnormality detection circuit 30 detects an abnormality in the temperature compensation coefficient of the non-volatile memory 60. For example, as described earlier, each memory cell of the non-volatile memory 60 stores the data of the temperature compensation coefficient and an error detection code or an error correction code which is generated based on the data. The abnormality detection circuit 30 detects an error in the data of the temperature compensation coefficient which is read from the non-volatile memory 60 based on the error detection code or the error correction code which is read together with the data. In a case in which an error is detected, the abnormality detection circuit 30 determines that there is an abnormality in the temperature compensation coefficient of the non-volatile memory 60 and uses the control terminal TCN to notify the external device such as the host device.

In a case in which there is an abnormality in the temperature compensation coefficient, for example, although the appropriate temperature compensation process is not performed, the clock signal CLK is output as ordinary to the external device via the output terminal TOUT. For example, in a case in which the temperature compensation process is not appropriately performed, since the frequency of the clock signal CLK is within a nominal frequency range at a typical temperature such as 25° C. with no temperature fluctuation, there is a problem in that an abnormal state of the clock signal CLK may not be appropriately detected.

For example, a method of detecting a fault in which two first and second oscillators are provided in a system and the frequency of the first clock signal which is output from the first oscillator is compared to the second clock signal which is output from the second oscillator is conceivable as the method of a comparative example of the present embodiment.

In this case, even if there is an abnormality in the temperature compensation coefficient of the first oscillator, for example, it is difficult to detect an abnormality in the temperature compensation coefficient by merely comparing the frequencies of the first and the second clock signals.

With regard to this point, in the present embodiment, in a case in which there is an abnormality in the temperature compensation coefficient of the non-volatile memory 60, the abnormality detection circuit 30 detects the abnormality. The oscillator 4 notifies the external device of an abnormality in the temperature compensation coefficient. Accordingly, it is possible to notify the external device of an abnormality in the temperature compensation coefficient which is ordinarily difficult to distinguish. For example, as described above, it will be assumed that in a system which handles abnormalities in the oscillator by installing first and second oscillators, an abnormality is detected in the temperature compensation coefficient of the first oscillator, for example. In this case, a countermeasure is possible in which the first oscillator is rendered unusable and the system is operated based on the second clock signal from the second oscillator. Accordingly, further improvements to the reliability of the system may be obtained.

2. Oscillation Circuit and Oscillator

Figure 8:
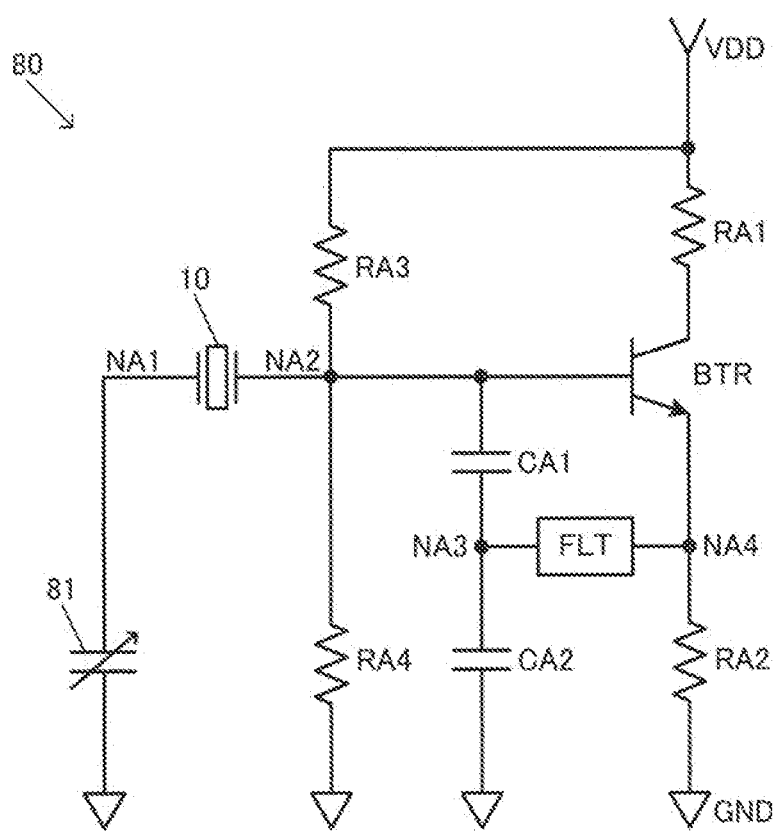
FIG. 8 is a first configuration example of the oscillation circuit.

Next, a description will be given of a specific example of the configuration of the oscillation circuit 80 and a specific example of the structure of the oscillator 4. FIG. 8 illustrates a first configuration example of the oscillation circuit 80. FIG. 8 is an example of a Colpitts-type oscillation circuit 80. A variable-capacitance capacitor 81 is provided between a node NA1 of one end of the resonator 10 and the GND node. A node NA2 of the other end of the resonator 10 is connected to the base of a bipolar transistor BTR. A resistance RA1 is provided between the VDD node and the collector of the bipolar transistor BTR and a resistance RA2 is provided between the emitter of the bipolar transistor BTR and the GND node. A resistance RA3 is provided between the VDD node and the node NA2 and a resistance RA4 is provided between the node NA2 and the GND node. Capacitors CA1 and CA2 are provided in series between the node NA2 and the GND node and a filter FLT is provided between a connection node NA3 of the capacitors CA1 and CA2 and a node NA4 of the emitter of the bipolar transistor BTR. The oscillation circuit 80 is not limited to the configuration of FIG. 8 and various embodiments are possible, such as one in which the connection configuration is different or the like. A Piarts-type oscillation circuit may be used as the oscillation circuit 80.

FIG. 9 illustrates a second configuration example of the oscillation circuit 80. In FIG. 9, the oscillation circuit 80 includes the drive circuit 82 which performs the oscillation driving of the resonator 10 and the fractional-N-type PLL circuit 84, and the fractional-N-type PLL circuit 84 includes the divider circuit 85. The frequency control data DFC from the processing circuit 50 of FIG. 2 is inputted to the fractional-N-type PLL circuit 84. Division ratio data based on the frequency control data DFC is set in the divider circuit 85 of the fractional-N-type PLL circuit 84. For example, the division ratio data which is obtained by performing the conversion process on the frequency control data DFC is set in the divider circuit 85. The fractional-N-type PLL circuit 84 performs phase comparison on the division clock signal which is output by the divider circuit 85 and an oscillation signal CK of the resonator 10 which is generated by the oscillation operation of the resonator 10 by the drive circuit 82, generates the oscillation signal OSCK which is an oscillation clock signal, and outputs the oscillation signal OSCK to the output circuit 90. Here, in addition to the divider circuit 85, the fractional-N-type PLL circuit 84 includes a phase comparator, a charge pump circuit, a low-pass filter, a voltage control oscillation circuit, a delta-sigma modulation circuit, an adding and subtracting circuit, and the like which are not illustrated. The phase comparator subjects the oscillation signal CK from the drive circuit 82 and the division clock signal from the divider circuit 85 to phase comparison. The charge pump circuit converts the pulse voltage which is output by the phase comparator to a current. The low-pass filter smoothens the current which is output by the charge pump circuit and converts the smoothened current to a voltage. The voltage control oscillation circuit outputs the oscillation signal OSCK which is set by the oscillation frequency according to the control voltage, using the output voltage of the low-pass filter as the control voltage. The divider circuit 85 uses the output signal of the addition and subtraction circuit as an integer division ratio N to divide the frequency of the oscillation signal OSCK which is output by the voltage control oscillation circuit by an integer and outputs the division clock signal. The delta-sigma modulation circuit performs delta-sigma modulation which integrates and quantizes a fractional division ratio L/M in synchronization with the division clock signal. The addition and subtraction circuit performs addition and subtraction of the delta-sigma modulation signal which is output by the delta-sigma modulation circuit and the integer division ratio N. By using the fractional-N-type PLL circuit 84 of this configuration, it is possible to generate the oscillation signal OSCK which multiplies the oscillation signal CK of the resonator 10 by the division ratio which is represented by N+L/M.

FIG. 10 illustrates a detailed configuration example of the oscillator 4 which includes the circuit device 20 of the present embodiment. As illustrated in FIG. 10, the oscillator 4 includes the resonator 10 and the circuit device 20. The resonator 10 and the circuit device 20 are installed inside the package 5 of the oscillator 4. The pads of the IC which are the terminals of the resonator 10 and the terminals of the circuit device 20 are connected by internal wiring, metal bumps, or the like of the package 5. For example, the resonator 10 includes a lower electrode 11 and an upper electrode 12. The lower electrode 11 and the upper electrode 12 are connected to the terminals P1 and P2, which are the pads of the circuit device 20 of FIG. 2, using the internal wiring or the like of the package 5. The bottom surface of the package 5 is provided with the terminals 6 which external connection terminals of the oscillator 4. Using the configuration of FIG. 1 as an example, four of the terminals 6 are provided on the bottom surface of the oscillator 4. Specifically, the power source terminal TVDD, the ground terminal TGND, the output terminal TOUT, and the control terminal TCN are provided as the terminals 6 of the bottom surface. The power source terminal TVDD, the ground terminal TGND, the output terminal TOUT, and the control terminal TCN are connected to the pads of the IC of the circuit device 20 by the internal wiring or the like of the package 5. Specifically, the power source terminal TVDD, the ground terminal TGND, the output terminal TOUT, and the control terminal TCN are connected to the terminals PVDD, PGND, POUT, and PCN which are the pads of the circuit device 20 of FIG. 2.

The oscillator 4 may be an oscillator having an oven structure such as a double oven structure, for example. In this case, a container, a heater, and the like which serve as a thermostat are provided inside the package 5.

3. Electronic Device and Vehicle

Figure 11:
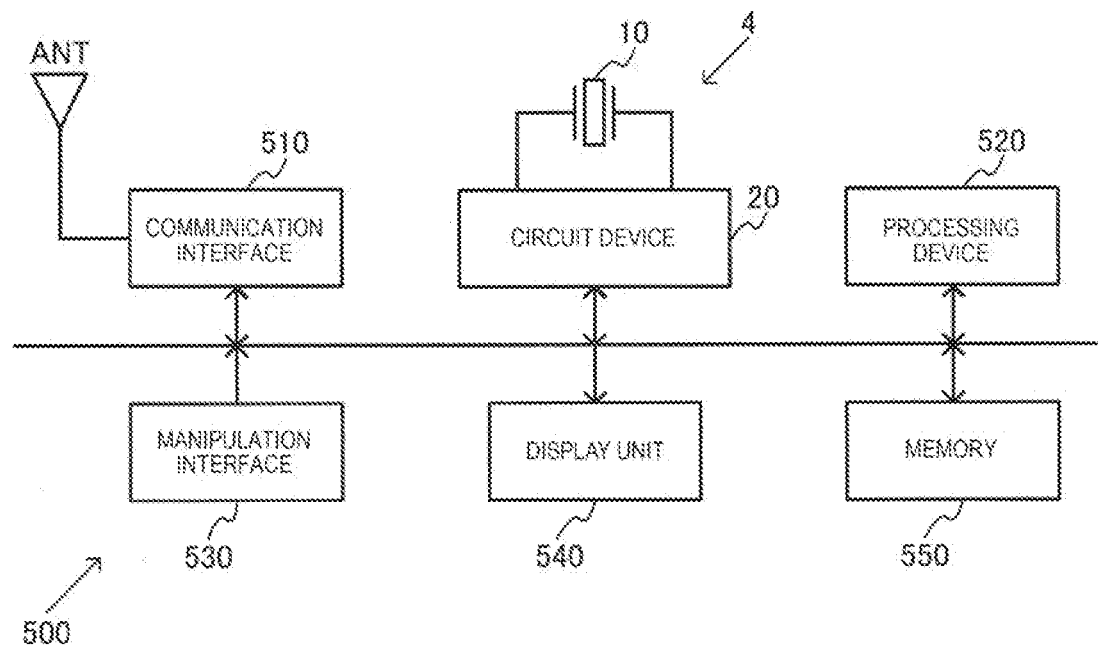
FIG. 11 is a configuration example of an electronic device.

FIG. 11 illustrates a configuration example of an electronic device 500 which includes the oscillator 4 of the present embodiment. The electronic device 500 includes the oscillator 4 of the present embodiment that includes the resonator 10 and the circuit device 20, and a processing device 520. The electronic device 500 is capable of including an antenna ANT, a communication interface 510, a manipulation interface 530, a display unit 540, and a memory 550. The oscillator 4 is configured by the resonator 10 and the circuit device 20. The electronic device 500 is not limited to the configuration of FIG. 11 and various modifications to the embodiment such as omitting a portion of the configuration elements and adding other configuration elements are possible.

For example, the electronic device 500 is a network-related device such as a base station or a router, a high-precision measurement device which measures a physical amount such as a distance, a time, a flow velocity, or a flow rate, a biological information measurement device which measures biological information, a vehicle-mounted device, or the like. The biological information measurement device is an ultrasonic measurement device, a pulse wave meter, a sphygmomanometry device, or the like, for example. The vehicle-mounted device is a device for self-driving or the like. The electronic device 500 may be a wearable device such as a head-mounted display device or a timepiece-related device, a robot, a printing apparatus, a projecting apparatus, a portable information terminal such as a smart-phone, a content provision device which delivers content, or an image device such as a digital camera or a video camera.

The communication interface 510 performs processes of receiving data from outside and transmitting data to the outside via the antenna ANT. The processing device 520 which is a processor performs the control process of the electronic device 500, various digital processing of the data which is transmitted and received via the communication interface 510, and the like. It is possible to realize the functions of the processing device 520 using a processor such as a microprocessor, for example. The manipulation interface 530 is for allowing a user to perform input manipulation and it is possible to realize the manipulation interface 530 using manipulation buttons, a touch panel display, or the like. The display unit 540 displays various information and it is possible to realize the display unit 540 using a liquid crystal, organic EL, or the like display. The memory 550 stores the data and it is possible to realize the functions of the memory 550 using semiconductor memory such as RAM or ROM.

Figure 12:
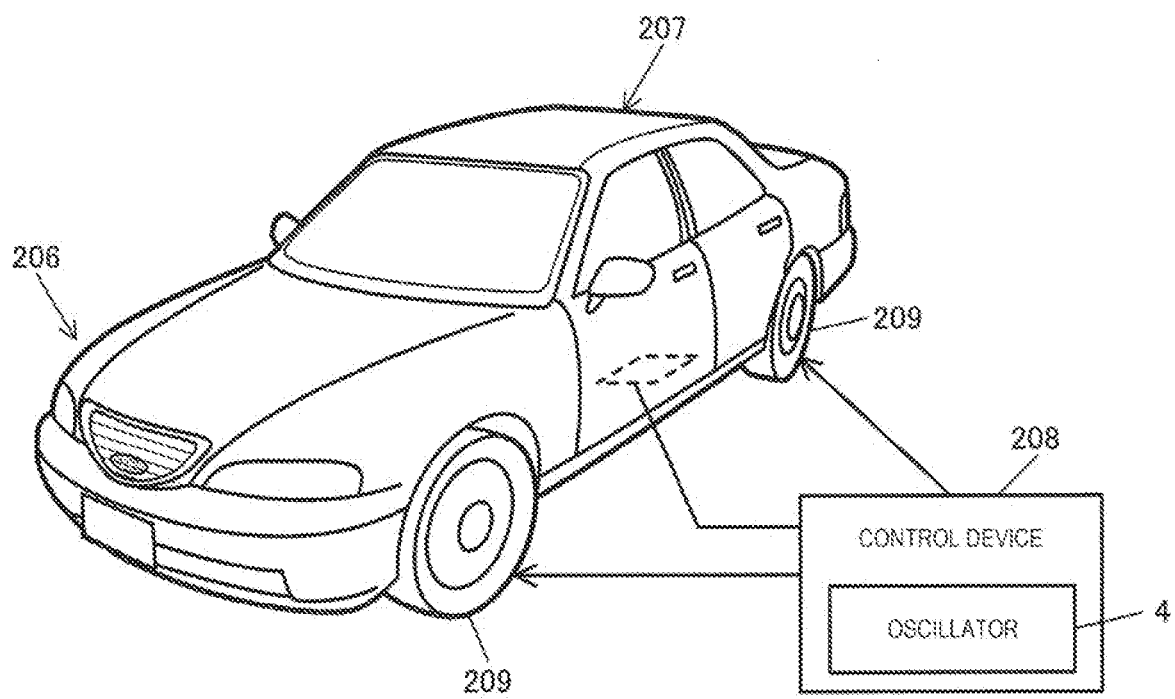
FIG. 12 is a configuration example of a vehicle.

FIG. 12 illustrates an example of a vehicle which includes the oscillator 4 of the present embodiment. It is possible to embed the oscillator 4 of the present embodiment in various vehicles such as automobiles, airplanes, motorbikes, bicycles, or ships, for example. The vehicle is provided with a drive mechanism such as an engine or a motor, a steering mechanism such as a steering wheel or a rudder, and various electronic devices, and is a device or an apparatus which moves on the ground, in the air, on the ocean, or the like. FIG. 12 schematically illustrates an automobile 206 which serves as a specific example of the vehicle. The oscillator 4 of the present embodiment which includes the resonator 10 and the circuit device 20 is embedded in the automobile 206. A control device 208 operates according to the clock signal which is generated by the oscillator 4. The control device 208 controls the firmness of the suspension according to the posture of a vehicle body 207, for example, and controls brakes of individual wheels 209. For example, self-driving of the automobile 206 may be realized by the control device 208. The device into which the oscillator 4 of the present embodiment is embedded is not limited to the control device 208, and it is possible to embed the oscillator 4 in various vehicle-mounted devices such as meter panel devices and navigation devices which are provided in a vehicle such as the automobile 206.

As described hereinabove, the oscillator of the present embodiment includes a resonator, a circuit device which is electrically connected to the resonator and which generates a clock signal, a control terminal which is electrically connected to the circuit device, and an output terminal which is electrically connected to the circuit device and which outputs the clock signal. The circuit device includes an abnormality detection circuit and sets the potential of the control terminal to an abnormality detection voltage when an abnormal state is detected by the abnormality detection circuit.

According to the present embodiment, the oscillator is provided with a resonator, a circuit device which generates a clock signal, a control terminal, and an output terminal of the clock signal. The circuit device includes an abnormality detection circuit and the potential of the control terminal is set to an abnormality detection voltage when an abnormal state is detected by the abnormality detection circuit. Accordingly, the external device is capable of detecting an abnormal state of the oscillator by monitoring the abnormality detection voltage which is set to the control terminal. Accordingly, even if a new terminal for detection of an abnormal state is not provided on the oscillator, it is possible to detect an abnormal state and it is possible to appropriately detect an abnormal state in an oscillator having a limited number of terminals.

In the present embodiment, when an abnormal state is detected by the abnormality detection circuit, the circuit device may change a set voltage of the control terminal from a pull-up voltage to the abnormality detection voltage.

Accordingly, in a case in which the control terminal is set to the pull-up voltage through pulling up in an ordinary state, the external device is capable of detecting an abnormal state of the oscillator by detecting that the set voltage of the control terminal changes from the pull-up voltage to the abnormality detection voltage.

In the present embodiment, the circuit device may include an oscillation circuit which causes the resonator to oscillate to generate an oscillation signal, an output circuit which outputs the clock signal based on the oscillation signal, and a voltage setting circuit which sets a potential of the control terminal to the abnormality detection voltage based on an abnormality detection signal from the abnormality detection circuit.

Accordingly, it is possible to appropriately notify the external device of an abnormal state through the voltage setting circuit merely setting the control terminal to an abnormality detection voltage corresponding to an abnormality detection signal.

In the present embodiment, the voltage setting circuit may change a set voltage of the control terminal from a pull-up voltage to the abnormality detection voltage based on the abnormality detection signal.

Accordingly, it is possible to appropriately notify the external device of an abnormal state through the voltage setting circuit changing the set voltage of the control terminal which is set to the pull-up voltage to an abnormality detection voltage.

In the present embodiment, the voltage setting circuit may include a pull-up resistance and a variable resistance which is connected to the pull-up resistance, and the voltage setting circuit may change the pull-up voltage to the abnormality detection voltage by changing a resistance value of the variable resistance based on the abnormality detection signal.

Accordingly, it is possible to change the pull-up voltage to the abnormality detection voltage by changing the resistance value of the variable resistance which is connected to a pull-up resistance based on an abnormality detection signal.

In the present embodiment, the control terminal may be an output control terminal of the clock signal.

Accordingly, it is possible to make effective use of the output control terminal of the clock signal to notify the external device of an abnormal state.

In the present embodiment, the control terminal may be a frequency control terminal of the clock signal.

Accordingly, it is possible to make effective use of the frequency control terminal of the clock signal to notify the external device of an abnormal state.

In the present embodiment, the abnormality detection circuit may detect a first abnormal state and a second abnormal state which is different from the first abnormal state. When the first abnormal state is detected by the abnormality detection circuit, the circuit device may set the abnormality detection voltage to a first voltage and when the second abnormal state is detected by the abnormality detection circuit, the circuit device may set the abnormality detection voltage to a second voltage.

Accordingly, due to the external device determining the voltage level of the abnormality detection voltage which is set to the control terminal, it is possible to determine which of the abnormal states the oscillator is in among the plurality of abnormal states such as the first and second abnormal states, and it is possible to execute the appropriate process corresponding to each of the abnormal states.

In the present embodiment, the abnormality detection circuit may detect at least one of an abnormality in an external power source voltage which is inputted via the power source terminal, an abnormality in the power source voltage which is generated by regulating the external power source voltage, and an abnormality in a processing circuit which performs a process of oscillation control.

Accordingly, it is possible to detect the external power source voltage and the power source voltage or an abnormal state of the processing circuit using the abnormality detection circuit and the external device is capable of executing the appropriate process corresponding to the abnormal states.

In the present embodiment, the oscillator may further include a non-volatile memory which stores data of a temperature compensation coefficient of a frequency of the clock signal, and the abnormality detection circuit may detect an abnormality in the temperature compensation coefficient of the non-volatile memory.

Accordingly, it is possible to notify the external device of an abnormality in the temperature compensation coefficient which is ordinarily difficult to distinguish.

The present embodiment relates to an electronic device including the oscillator. The present embodiment relates to a vehicle including the oscillator.

Hereinabove, although a detailed description is given of the present embodiment, a person skilled in the art is able to easily understand that many modifications not substantively departing from the novel items and effects of the present disclosure are possible. Therefore, such modification examples are all to be included in the scope of the present disclosure. For example, in the specification and the drawings, terms which appear at least once together with a more general term or a different term of a similar definition may be replaced with the different term at any location in the specification or the drawings. All combinations of the present embodiment and the modification examples are included in the scope of the present disclosure. Additionally, the configurations and operations of the oscillator, the electronic device, and the vehicle, the terminal configuration of the oscillator, the configuration of the circuit device, and the abnormality detection method are not limited to those described in the present embodiment and various embodiments are possible.

What is claimed is:

1. An oscillator comprising:
   a resonator;
   a circuit device that is electrically coupled to the resonator and generates a clock signal;
   a control terminal that is electrically coupled to the circuit device; and
   an output terminal that is electrically coupled to the circuit device and outputs the clock signal, wherein
   the circuit device includes an abnormality detection circuit, and the circuit device sets a potential of the control terminal to an abnormality detection voltage when an abnormal state is detected by the abnormality detection circuit, and
   when an abnormal state is detected by the abnormality detection circuit, the circuit device changes a set voltage of the control terminal from a pull-up voltage to the abnormality detection voltage.

2. The oscillator according to claim 1, wherein the control terminal is an output control terminal of the clock signal.

3. The oscillator according to claim 1, wherein the control terminal is a frequency control terminal of the clock signal.

4. The oscillator according to claim 1, wherein
   the abnormality detection circuit detects at least one of an abnormality in an external power source voltage that is inputted via a power source terminal, an abnormality in a power source voltage that is generated by regulating the external power source voltage, and an abnormality in a processing circuit that performs a process of oscillation control.

5. The oscillator according to claim 1, further comprising:
   a non-volatile memory that stores data of a temperature compensation coefficient of a frequency of the clock signal, wherein
   the abnormality detection circuit detects an abnormality in the temperature compensation coefficient of the non-volatile memory.

6. An oscillator comprising:
   a resonator;
   a circuit device that is electrically coupled to the resonator and generates a clock signal;
   a control terminal that is electrically coupled to the circuit device; and
   an output terminal that is electrically coupled to the circuit device and outputs the clock signal, wherein
   the circuit device includes an abnormality detection circuit, and the circuit device sets a potential of the control terminal to an abnormality detection voltage when an abnormal state is detected by the abnormality detection circuit,
   the circuit device includes
      an oscillation circuit that causes the resonator to oscillate to generate an oscillation signal,
      an output circuit that outputs the clock signal based on the oscillation signal, and
      a voltage setting circuit that sets a potential of the control terminal to the abnormality detection voltage based on an abnormality detection signal from the abnormality detection circuit, and
   the voltage setting circuit changes a set voltage of the control terminal from a pull-up voltage to the abnormality detection voltage based on the abnormality detection signal.

7. The oscillator according to claim 6, wherein
   the voltage setting circuit includes a pull-up resistance and a variable resistance that is coupled to the pull-up resistance, and the voltage setting circuit changes the pull-up voltage to the abnormality detection voltage by changing a resistance value of the variable resistance based on the abnormality detection signal.

8. An oscillator comprising:
   a resonator;
   a circuit device that is electrically coupled to the resonator and generates a clock signal;

a control terminal that is electrically coupled to the circuit device; and
an output terminal that is electrically coupled to the circuit device and outputs the clock signal, wherein
the circuit device includes an abnormality detection circuit, and the circuit device sets a potential of the control terminal to an abnormality detection voltage when an abnormal state is detected by the abnormality detection circuit, and
the abnormality detection circuit detects a first abnormal state and a second abnormal state that is different from the first abnormal state, and when the first abnormal state is detected by the abnormality detection circuit, the circuit device sets the abnormality detection voltage to a first voltage, and when the second abnormal state is detected by the abnormality detection circuit, the circuit device sets the abnormality detection voltage to a second voltage.

9. An electronic device, comprising:
the oscillator according to claim 1.

10. A vehicle, comprising:
the oscillator according to claim 1.

\* \* \* \* \*